United States Patent [19]

Wong et al.

[11] Patent Number: 5,174,830

[45] Date of Patent: * Dec. 29, 1992

[54] SUPERCONDUCTOR AND PROCESS OF MANUFACTURE

[75] Inventors: James Wong, Wayland; Mark K. Rudziak, Westminster, both of Mass.

[73] Assignee: Composite Materials Technology, Inc., Shrewsbury, Mass.

[*] Notice: The portion of the term of this patent subsequent to Oct. 27, 2009 has been disclaimed.

[21] Appl. No.: 628,406

[22] Filed: Dec. 17, 1990

Related U.S. Application Data

[63] Continuation-in-part of Ser. No. 586,264, Sep. 21, 1990, and a continuation-in-part of Ser. No. 560,163, Jul. 31, 1990, and a continuation-in-part of Ser. No. 540,193, Jun. 19, 1990, and a continuation-in-part of Ser. No. 480,236, Feb. 15, 1990, and a continuation-in-part of Ser. No. 363,634, Jun. 8, 1989, Pat. No. 4,925,741.

[51] Int. Cl.$^5$ .............. C22C 1/18; H01L 39/12; H01L 39/24; H01B 12/02
[52] U.S. Cl. ............................ 148/96; 29/599; 505/918; 505/921
[58] Field of Search .............. 428/930, 660, 661, 662, 428/610, 614; 148/11.5 Q, 11.5 F; 29/599; 505/1, 812, 813, 919, 921, 814, 918; 419/6, 7, 8

[56] References Cited

U.S. PATENT DOCUMENTS

| | | | |
|---|---|---|---|
| 3,465,430 | 9/1969 | Barber et al. | 29/599 |
| 3,534,459 | 10/1970 | Kudo et al. | 29/599 |
| 3,625,662 | 12/1971 | Roberts et al. | 428/610 |
| 3,652,967 | 3/1972 | Tanaka et al. | 505/879 |
| 3,665,595 | 5/1972 | Tanaka et al. | 29/599 |
| 3,728,165 | 4/1973 | Howlett | 148/127 |
| 4,803,310 | 2/1989 | Zeitlin et al. | 174/125.1 |
| 4,959,279 | 9/1990 | Tanaka et al. | 428/660 |
| 4,973,527 | 11/1990 | Smathers | 428/930 |

FOREIGN PATENT DOCUMENTS 45584  2/1982  European Pat. Off. ............ 428/930

Primary Examiner—John Zimmerman
Attorney, Agent, or Firm—Hayes, Soloway, Hennessey & Hage

[57] ABSTRACT

A superconductor which is superconducting of a predetermined high field and low temperature is formed by combining a plurality of metal bodies to form a composite structure. The metal bodies are selected from transition metals such as niobium, tantalum, zirconium, hafnium and vanadium, and alloys of such metals, alternate bodies being formed of ductile alloys of the metals which are not superconducting at the predetermined high field. The alternate bodies of transition metals are reacted to form a ductile superconducting ternary alloy zone at the interfaces of these bodies. The extent of the reaction is limited so as to maintain areas of transition metal and transition metal alloys which are not superconducting at the high field. The composite structure is reduced sufficiently that each non superconducting zone is less than 1000A° thick and serves as an artificial pinning site for each adjacent superconducting zone.

9 Claims, 3 Drawing Sheets

SUPERCONDUCTOR AND PROCESS OF MANUFACTURE

This invention relates to the production of improved superconductors. This application is, in part, a continuation of our co-pending applications, Ser. No. 07/480,236 filed Feb. 15, 1990, Ser. No. 07/586,264 filed Sep. 21, 1990, Ser. No. 07/540,193 filed Jun. 19, 1990, Ser. No. 07/560,163 filed Jul. 31, 1990, and Ser. No. 07/363,634 filed Jun. 8, 1989, now U.S. Pat. No. 4,925,741. The disclosures of said parent applications is incorporated herein in their entirety.

BACKGROUND OF THE INVENTION

In a preferred form of the invention described in the related applications, a superconductor is produced by the steps of combining a plurality of layers of metal sheets to form a composite structure. The sheets are preferably pure transition metals—niobium, titanium, zirconium, or vanadium, for example—alternate sheets being formed of different transition metals. The resulting composite structure is mechanically reduced sufficiently so that each transition metal sheet is less than 1000 Å thick. In the course of reduction, the composite is subjected to sufficient temperatures for sufficient times such that the transition metal layers are partially reacted to form a ductile superconducting material between the transition metal layers.

Approximately one half by volume of the transition metal layers remain unreacted. These unreacted layers afford efficient flux pinning within the composite when the layers are reduced to the <1000 Å final size. In the fabrication of ternary (or higher order) alloys like NbTiTa, one or more of the transition metal layers is made relatively thin so as to allow complete diffusion through that region. However, at least one half by volume of one of the constituent transition metal layers remains pure or nearly pure after the reaction so as to provide pinning within the ternary composite when reduced to <1000Å in thickness. In other embodiments, powders and filaments can be used instead of initial layers.

Aside from core materials, the multilayer composites described in the examples of the parent applications are composed solely of pure metals. Such composites are undoubtedly useful, but the efficiency of the superconductor fabrication can be greatly improved if one or more of the constituent layers used in the monofilament billet is an alloy, rather than a pure metal. The alloy, which may or may not be a superconductor, can be layered with pure metal or with another alloy, depending upon the superconducting properties ultimately desired. Diffusion in the course of processing this material creates layers of superconducting alloy, which may be similar to, but is not identical with, the initial alloy.

That alloy layers, rather than pure metal layers, are utilized in the present invention in no way affects the core principles of the invention. These principles can be briefly stated as follows:

1. A composite characterized by alternating layers of two or more metals.
2. Processing the composite at elevated temperatures in order to:
    a. bond the metal layers, thus facilitating reduction of the composite; and
    b. create, by diffusion, layers of superconducting material at the metal-to-metal interfaces of the composite, while also maintaining regions of unreacted metal.
3. Mechanically reducing the composite so that the reacted and unreacted layers are less than 1000 Å in thickness.

In the parent applications, these principles are only applied to pure metal layers, primarily because pure metals are generally less expensive, and thus more desirable, than alloys. However, for reasons related to fabricability and improved performance, the benefits of alloy layers will sometimes outweigh the added costs. The use of alloy layers in accordance with the invention is the focus of the present application.

U.S. Pat. No. 4,803,310, held by Intermagnetics General Corporation, describes a composite characterized by a layered structure of a superconducting alloy and a non-superconducting—i.e., "normal"—metal, the latter serving to pin the flux lines in the composite. While generally similar to the composites of the present invention, the IGC composites incorporates as a normal metal one that "will not diffuse, or will diffuse only nominally" (volume 2, lines 47-48) into the superconducting alloy. By contrast, the present invention requires that a significant fraction of the normal metal diffuses into the adjacent layers in the composite. Only in this way are the desired superconducting layers created.

BRIEF DESCRIPTION OF THE INVENTION

The product of the present invention is a composite conductor containing alternating layers of superconducting and normal materials, each layers being <1000 Å thick, at which size the normal regions serve as flux pinning sites within the composite, allowing the attainment of higher current densities ($J_c$'s) than would be possible in the absence of these sites. The composite is fabricated by assembling a series of metal layers inside a normal metal sheath and than hot processing the resultant billet to a size where the layers are <1000 Å thick. The initial metal layers may be either pure metals or alloys provided that: 1) At least one of the constituent layers is a normal metal capable of providing flux pinning within the composite at operating magnetic field levels; and 2) A superconducting alloy is formed between the normal metal layers as a result of diffusion during processing.

In order to more fully understand the invention, reference should be had to the following detailed description taken in conjunction with the attached drawings, wherein:

DETAILED DESCRIPTION OF THE INVENTION

Figure 1:
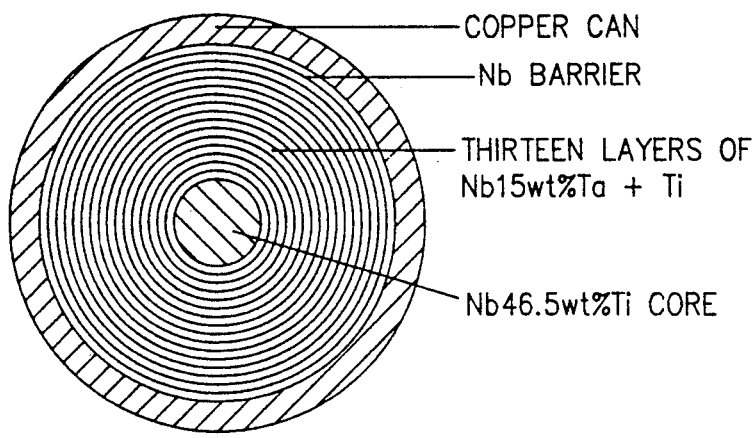
FIG. 1 is a schematic diagram of a monofilament billet containing sheets of Nb15wt%Ta and Ti wrapped around a Nb46.5wt%Ti core.

In a preferred form of the present invention, sheets of pure transition metal are layered and then wrapped around a core. When this material is processed, small layer thicknesses are quickly and easily obtained. The processing includes hot operations, such as hot isostatic pressing (HIP'ing), hot extrusion, and heat treatment, along with cold deformation by means of swaging, drawing, or rolling. During processing, ductile superconducting material is formed at the interfaces of the layered sheets such that approximately one half of the sheet thicknesses remain unreacted. These unreacted layers of transition metal afford pinning within the composite when reduced to <1000 Å thick. The presence of pinning sites in the composite allows the development of superior $J_c$'s. Here, a pinning site is defined as an interface between normal and superconducting material. In general, the greater the pinning site density within the composite, the better the low field (1-5T) $J_c$.

The thickness of the normal and superconducting layers is critical to the ultimate performance of the composite. If the layer thicknesses are too large, i.e., not on the order of the fluxoid spacing at the particular magnetic field, then inefficient pinning results. On the other hand, it the layers are reduced too much, mechanical and diffusional problems are introduced, as are proximity effects, serving to degrade the critical current density and upper critical field of the composite. In the present embodiment alloys are used in order to expedite the formation of superconducting material during reaction. In general, two types of alloys will be of use in this embodiment:

I. Normal metal alloys, such as NbTa, TiTa, or HfZr, which simplify ternary (or higher order) superconductor fabrication, but which do not themselves superconduct at useful magnetic fields; and II. Ductile superconducting metal alloys, such as NbTi or NbZr, which can be combined with normal metals (pure or alloy) to form layers of superconducting material having better superconducting properties than the original alloy.

These cases will be dealt with separately.

CASE I

The fabrication of composites containing ternary superconductors like NbTiTa is difficult if only the pure metals are used, because at least one of the metals must diffuse completely before the superconductor will form. This is a slow process, requiring binary formation (NbTa and TiTa, e.g.) before the ternary (NbTiTa) can be realized. A two component system is much more efficient, with all diffusion going towards formation of the superconductor, rather than intermediate alloys. For ternary (or higher order) superconductors, the two components obviously must include at least one alloy. NbTiTa, for example, is ideally formed from a NbTa alloy and pure Ti. Other possibilities are TiTa+Nb, NbTi+Ta, NbTi+TiTa, and NbTi+NbTa, where the latter three are Case II combinations. Alloys like NbTa and TiTa are what will be termed "precursor alloys", by which is meant that the alloys are not themselves superconducting at operating fields, but are necessary for the formation of a ternary (or higher order) superconductor.

It is not necessary for precursor alloy layers to be wholly alloy, since the superconductor need not extend all the way across these layers. An adequate layer of alloy material can be created on the surface of an otherwise pure metal by depositing relatively thin layers of other metals onto the surface and then subjecting the combination to sufficient temperatures for sufficient times to react the metals at the layer surface. The deposition of a second metal can be accomplished by means such as sputtering the second metal onto the first or by coreducing the first and second metals to the point where they are bonded. After reaction, the material is layered with one or more other metals to make a composite in just the same way as is 100% alloy material.

It will be noted that the thin alloy layer described here could just as easily be incorporated as a separate layer of 100% alloy. while this is certainly true, it will frequently be the case that the desired alloy composition will not be readily available or will be prohibitively expensive. In such cases, the above methods produce material suitable for use in the alloy-based, artificially pinned composite. Another advantage to these methods is that the alloy layer is thoroughly bonded to the pure metal substrate prior to fabrication of the monofilament, which can only be of help in later processing.

In accordance with the invention, an artificially pinned superconducting composite can be fabricated as described in the following non-limiting examples, where Example I involves the use of a 100% alloy sheet and Example II involves partially alloyed sheet:

EXAMPLE I

The process begins by constructing a copper clad monofilament billet containing alternating layers of Nb15wt%Ta alloy and pure titanium around a Nb46.5wt%Ti core (see FIG. 1). Reaction of the layers during processing forms a NbTiTa superconducting alloy at the interfaces of the otherwise normal NbTa and titanium layers. The layer thicknesses are chosen so that after this reaction, thin layers of unreacted NbTa and Ti will remain to act as pinning sites within the ternary conductor. These considerations result in a Nb15wt%Ta to titanium ratio of 1:1 by volume. For this example, the thickness of both layers in the monofilament is chosen to be 0.016". The overall core length (sheet width) is 6.0" Extra niobium is placed at the can/core interface in order to prevent reaction between the titanium layers and the copper can. All components of the billet are thoroughly cleaned prior to billet assembly.

After assembly, the monofilament billet is electron beam welded shut in vacuum and then HIP'd at 650° C. for four hours at a pressure of 15 ksi. The billet is then machined to 2.0" in diameter in order to fit a 2.125" extrusion liner. Prior to extrusion, the billet is heated at 650° C. for two hours. The billet is then extruded at 650° C. to 0.50" in diameter at a rate of 15 ipm. The extruded rod is cold-drawn at an areal reduction rate of 20% per die pass to 0.030" in diameter. This wire is straightened, cut into 4.75" lengths, and then immersed in a nitric acid solution in order to pickle off the copper cladding. The resulting filaments are stacked into a copper extrusion can (2.50" outer diameter by 1.75" inner diameter) lined with 0.010" of niobium, the niobium here, as in the case of the monofilament, serving to prevent copper contamination of the material. The new billet thus produced contains almost 4000 niobium-clad filaments.

The restack billet is processed in just the same way as the monofilament billet, ultimately being drawn to approximately 0.010" in diameter, where the NbTa and titanium layers are less than 1000 Å in thickness, a size at which these layers provide effective flux pinning within the composite. The diffusion at the NbTa/Ti interfaces results directly in the formation of superconducting NbTiTa, rather than the intermediate binary alloys that would be formed if only pure metal layers were utilized. Approximately half of the titanium and half of the NbTa by volume reacts, resulting in an average composition of Nb18wt%Ta32wt%Ti at the interfaces, although strong compositional gradients are, of course, present.

EXAMPLE II

Figure 2:
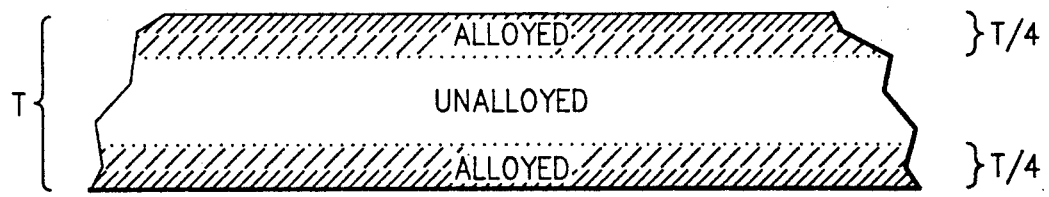
FIG. 2 is a schematic diagram of a partially alloyed sheet.

In order to minimize the need for expensive materials like NbTa alloys, the alloy layer of Example I can be replaced by a partially alloyed material. As indicated in FIG. 2, such a material is one in which the alloy is carried on the surface of an otherwise pure metal, extending into the layer only about one quarter of the total layer thickness. For niobium and tantalum, such a layer can be created by extruding a monofilament billet containing tantalum around a niobium core, removing the copper cladding, rolling the result into sheet, applying an intermediate heat treatment in the course of reduction, and annealing the final sheet. The intermediate heat treatment serves to diffuse the tantalum into the niobium; it is applied at a relatively large sheet thickness in order to allow better control over the extent of diffusion. The final anneal primarily serves to restore the workability of the material, although some diffusion occurs at this stage also.

In addition to avoiding costly melting operations, the method described here for the fabrication of partially alloyed sheet allows great flexibility in the tantalum content of the NbTiTa. By simply extending or abbreviating the heating time, a precursor alloy sheet having lower or higher amounts of surface tantalum can be produced, which directly affects the tantalum content in the ternary. The detailed processing steps for the fabrication of a Nb/Ta precursor alloy sheet are given below.

Figure 3:
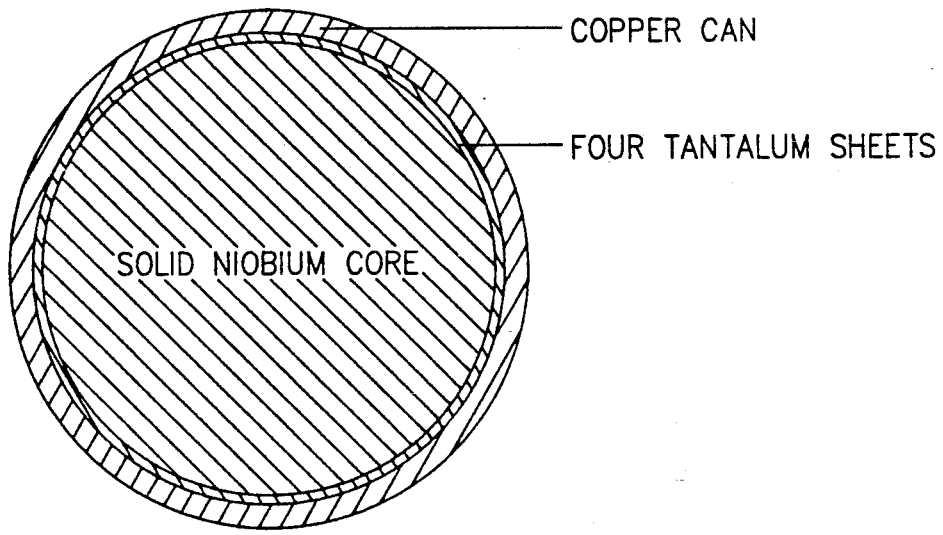
FIG. 3 is a schematic diagram of a monofilament billet containing sheets of Ta wrapped around a Nb core.
Figure 4:
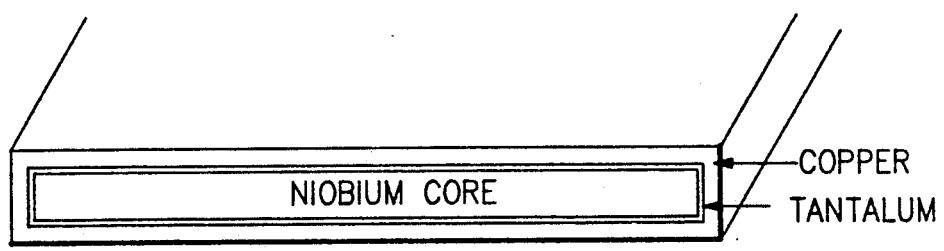
FIG. 4 is a schematic diagram of the monofilament of FIG. 3 after extrusion into a rectangular bar.

A typical can design for the Nb/Ta billet is shown in FIG. 3. Four 0.015" thick by 12.0" long sheets of high purity (99.99% or better) tantalum are wrapped around a 5.28" diameter, 12.0" long niobium core, and this assembly is inserted into a copper extrusion can. All of these components are cleaned prior to billet assembly. After assembly, the copper nose and tail of the billet are electron beam welded into place in vacuum, and then the billet is prepared for extrusion by heating at 650° C. for two hours. The billet is extruded at 650° C. to a rectangular cross section 4.0" wide by 0.50" high, as shown schematically in FIG. 4.

The extruded bar is immersed in a nitric acid solution in order to pickle off the copper, and the resulting Nb/Ta bar is cold rolled at an areal reduction rate of 10% per pass to a width of 6.0" and a thickness of 0.10". This material is thoroughly degreased with acetone and is then heat treated in vacuum to react the niobium and the tantalum. The heat treatment is at 1200° C. for two hours. After the heat treatment, the sheet is rolled at the same reduction rate to a final thickness of 0.016". The sheet is degreased and then given a final anneal in vacuum for one hour at 1000° C. The final strip is pure niobium except for a 0.004" thick layer of NbTa on each side. The average composition of this alloy layer is Nb15wt%Ta.

The precursor alloy strip is wound along with pure titanium sheet (also 0.016" thick) around a Nb46.5wt%Ti core, just as indicated in FIG. 1 for the 100% alloy sheet. The processing of this billet then proceeds as explained in Example I, above.

Diffusion during processing converts the bulk of the NbTa region (and an equivalent volume of titanium) into superconducting Nb18wt%Ta32wt%Ti. These superconducting layers are separated by pure niobium and titanium layers of comparable thickness. When the thickness is <1000 Å, the pure metal regions provide efficient flux pinning within the ternary conductor.

CASE II

In addition to normal alloys, alloys that are superconducting at operating fields can be utilized in accordance with the invention. In these situations, the diffusion during processing produces superconducting layers having improved properties relative to the original alloy. The improved layers may constitute all or only part of the initial alloy layers, depending upon the final properties desired. The primary advantage to the use of superconducting alloy layers is that it is much easier to improve an existing superconducting material than it is to create the improved superconductor from non-superconducting constituents.

The properties of a superconducting alloy can be altered in two ways, both of which are important to the present invention:
1. The concentrations of the constituent metals can be altered.
2. New metals can be added to the alloy.

In terms of the present invention, the first point refers to the combination of an alloy with one or more of the pure metals that constitute that alloy. NbTi+Nb and NbTi+Ti are examples of such combinations. The NbTi layer created by diffusion at a NbTi/Nb interface will necessarily contain more niobium (less titanium) than the original NbTi layer. Just the opposite is true at a NbTi/Ti interface. The diffusion thus results in a distinctly different alloy than is originally put into the composite, although the basic constituents are the same.

The second method by which to alter the properties of a superconducting alloy is to simply add to the alloy one or more metals that are not constituents of the alloy. In the present invention, this is accomplished by layering an alloy with a metal containing the desired additive. For example, NbTi can be layered with TiTa to produce, by diffusion, layers of NbTiTa superconductor.

In some cases, it may be desirable to completely react one or more of the layers in a composite. This is within the purview of the invention provided that regions of normal metal are maintained to act as pinning sites. If, for example, a billet containing layers of Ti+NbTi+Ti+Nb is constructed with relatively thin layers of titanium, the titanium will completely diffuse into the neighboring layers during subsequent processing. This surplus titanium has two important effects. First, the additional titanium offsets the titanium that would be lost to the niobium in a simple NbTi+Nb configuration. Second, the diffusion of titanium into the NbTi creates a region of high-titanium NbTi, which, generally speaking, gives higher $J_c$ than standard NbTi alloy (Nb46.5wt%Ti, e.g.).

An interesting consequence of using superconducting alloys in the artificially pinned composite is that flux pinning becomes more complicated. When layers of the original superconducting alloy are present in the final composite, they may or may not contribute to flux pinning. That is, it may or may not be the case that at some magnetic field levels the initial alloy layers behave like normal metal layers, while the reacted layers remain superconducting. This will not occur unless the upper critical field ($H_{c2}$) of the newly created superconducting alloy exceeds that of the initial alloy. Suppose, for example, that the superconducting alloy AB is combined with the pure metal C to form the ternary superconductor ABC. If the $H_{c2}$ of AB is 5T and the $H_{c2}$ of ABC is 11T, then AB can provide flux pinning in the field range of 5-11T, but not in the range of 0-5T. This effect is actually only an extension of the basic invention, since "normal" metals like Nb are, in fact, superconducting at fields below about 1T, and so behave as described above in this very low field range.

In accordance with the invention, artificially pinned composites utilizing ductile superconducting alloy layers can be fabricated as described in the following non-limiting examples:

EXAMPLE III

A monofilament billet in constructed as described in Example I, above, with the exception that Nb30wt%Ti is used in place of Nb15wt%Ta. Subsequent processing of the billet is also described in Example I.

Approximately one half by volume of the NbTi and titanium layers react during processing, resulting in an average composition of Nb58wt%Ti in the reacted zone. This relatively high titanium content results in higher $J_c$'s than would be obtained if no diffusion occurred (i.e., relative to Nb30wt%Ti). Pinning within the composite is provided by the unreacted titanium layers when these layers are at their <1000 Å final size.

EXAMPLE IV

Figure 5:
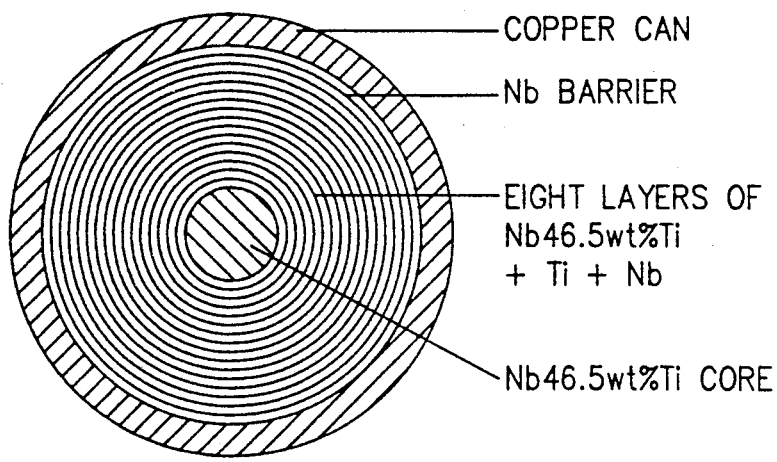
FIG. 5 is a schematic diagram of a monofilament billet containing sheets of Nb46.5wt%Ti, Nb, and Ti wrapped around a Nb46.5wt%Ti core.

A monofilament billet is assembled in accordance with the diagram shown in FIG. 5. Each layer in the billet consists of 0.016" thick Nb46.5wt%Ti+0.008" Ti+0.016" Nb+0.008" Ti. The assembly and processing of the billet are exactly as described in Example I, above.

In the course of processing, all of the pure titanium in the composite is reacted with approximately one half by volume of the adjacent niobium and NbTi layers. The result is an average composition near Nb74wt%Ti at the NbTi/Ti interfaces and Nb35wt%Ti at the Nb/Ti interfaces. The unreacted niobium provides flux pinning in the final composite.

It has been assumed here that the titanium diffusion produces two fairly distinct regions corresponding to the NbTi/Ti and the Nb/Ti interfaces. If a lesser amount of titanium were utilized, or if more diffusion were allowed, a mixture of the two alloys given above would result. It will be seen that this situation is not significantly different than that described in the example, but is only more complicated.

EXAMPLE V

Figure 6:
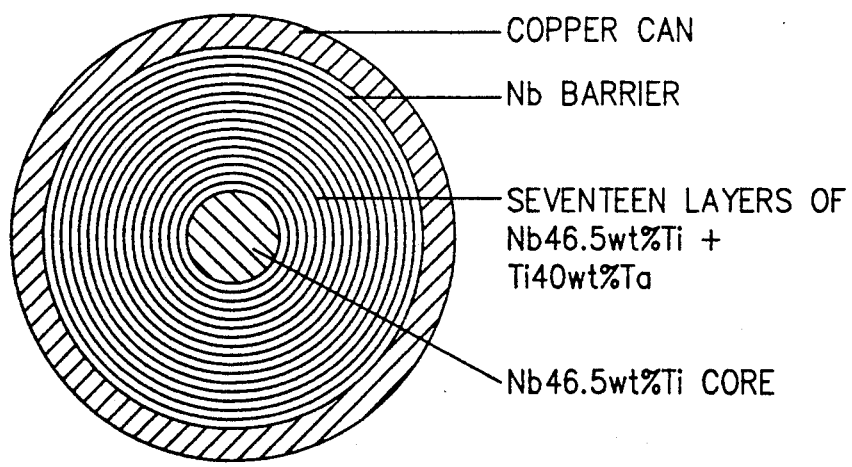
FIG. 6 is a schematic diagram of a monofilament billet containing sheets of Nb46.5wt%Ti and Ti40wt%Ta wrapped around a Nb46.5wt%Ti core.

A monofilament billet is assembled in accordance with the diagram shown in FIG. 6. Each layer in the billet consists of 0.008" thick Nb46.5wt%Ti+0.016" Ti40wt%Ta. The assembly and subsequent processing of the billet are as described in Example 1, above.

In the course of processing, all of the NbTi and approximately one half by volume of the TiTa are reacted, resulting in superconducting layers having the average composition Nb19wt%Ta39wt%Ti. The unreacted TiTa layers provide flux pinning within the ternary composite when reduced to their <1000Å final size.

We claim:

1. A method for producing a superconductor which is superconducting at a predetermined high field and low temperature comprising the steps of combining a plurality of metal bodies to form a composite structure, said metal bodies being selected from the transition metals niobium, tantalum, titanium, zirconium, hafnium and vanadium, and alloys of such metals, alternate bodies being formed of ductile alloys of said metals which are not superconducting at said predetermined high field, reacting the alternate bodies of transition metals to form a ductile superconducting ternary alloy zone at the interfaces of these bodies, limiting the extent of the reaction so as to maintain zones of transition metal and transition metal alloys which are not superconducting at said high field along with the superconducting ternary alloy mechanically reducing the composite structure sufficiently that each non superconducting zone is less than 1000 Å thick and serves as an artificial pinning site for each adjacent superconducting zone.

2. A superconducting wire made by the process of claim 1.

3. The process of claim 1 wherein the three transition metals are Nb, Ta and Ti, the tantalum layer being positioned between the Nb and Ti layers and being less than half as thick as each of the other two layers.

4. The process of claim 3 wherein Nb and Ta are coextruded and partially reacted to produce a layer of NbTa alloy.

5. The process of claim 1 wherein the three transition metals are Nb, Ta and Ti, the Ti being positioned between the Nb and Ta.

6. The process of claim 5 wherein an additional layer of Ti is on the second side of the Ta layer.

7. A method for producing a superconductor which is superconducting at a predetermined high field comprising the steps of producing a composite structure from a plurality of different metal bodies, said metal bodies including at least three of the transition metals niobium, titanium, tantalum, zirconium, vanadium, hafnium, and alloys of such metals which are not superconducting, compacting said composite structure to provide a metal-to-metal bond, reacting the transition metals to form a ductile superconducting ternary alloy zone at the interfaces of these metals, limiting the extent of the reaction so as to maintain zones of transition metal or transition metals which are not superconducting at said high field, along with the zones of superconducting alloy and mechanically reducing the composite structure sufficiently that each transition metal body is less than 1000 Angstroms thick, whereby each said undiffused transition metal zone serves as an artificial pinning site for each adjacent superconducting zone.

8. A superconducting wire made by the process of claim 7.

9. A method for producing a superconductor which has a superconducting high $J_c$ at a predetermined field and low temperature comprising the steps of combining a plurality of metal bodies to form a composite structure, said metal bodies being selected from the transition metals niobium, tantalum, titanium, zirconium, hafnium and vanadium, and alloys of such metals, alternate bodies being formed of ductile alloys of said metals which do not have said superconducting $J_c$ at said predetermined field, reacting the alternate bodies of transition metals to form a ductile high $J_c$ superconducting ternary alloy zone at the interfaces of these bodies, limiting the extent of the reaction so as to maintain zones of transition metal and transition metal alloys which are not superconducting at said field along with the superconducting ternary alloy mechanically reducing the composite structure sufficiently that each non superconducting zone is less than 1000 Å thick and serves as an artificial pinning site for each adjacent superconducting zone.

* * * * *